United States Patent [19]

Heo et al.

[11] Patent Number: 6,021,563

[45] Date of Patent: Feb. 8, 2000

[54] MARKING BAD PRINTED CIRCUIT BOARDS FOR SEMICONDUCTOR PACKAGES

[75] Inventors: Young Wook Heo; Il Kwon Shim, both of Seoul, Rep. of Korea

[73] Assignees: ANAM Semiconductor Inc., Rep. of Korea; AMKOR Technology, Inc., Chandler, Ariz.

[21] Appl. No.: 08/882,687

[22] Filed: Jun. 25, 1997

[30] Foreign Application Priority Data

Dec. 6, 1996 [KR] Rep. of Korea .................. 96-62305

[51] Int. Cl.[7] ................................. H01R 43/00
[52] U.S. Cl. ................ 29/846; 29/827; 257/669
[58] Field of Search .............. 29/825, 827, 832, 29/833, 840

[56] References Cited

U.S. PATENT DOCUMENTS

| | | | |
|---|---|---|---|
| 3,611,061 | 10/1971 | Segerson | 29/827 X |
| 5,008,614 | 4/1991 | Shreeve et al. | 29/827 X |
| 5,355,018 | 10/1994 | Fierkens | |
| 5,365,655 | 11/1994 | Rose | 29/827 |
| 5,661,086 | 8/1997 | Nakashima et al. | 29/827 X |
| 5,710,064 | 1/1998 | Song et al. | 29/827 X |

*Primary Examiner*—Carl J. Arbes
*Attorney, Agent, or Firm*—Skjerven, Morrill, MacPherson, Franklin & Friel LLP

[57] ABSTRACT

A method for marking poor quality printed circuit board units of a printed circuit board strip for ball grid array semiconductor packages wherein at least one degradation-indicating hole is at least partially formed in a poor quality printed circuit board unit of the strip at a region defined between an outer edge of the resin seal molding region of the unit and a cutting line formed on the printed circuit board strip to separate the unit from the strip. Even when a plurality of printed circuit board strips are packed in a vacuum under the condition in which they are stacked, there is no phenomenon that those strips in the pack are permanently deformed, for example, permanently bent. Also, there is no phenomenon that melt resin is leaked from the mold, thereby causing it to be bled out onto the upper surface of the printed circuit board strip. Since no paint is used to mark poor quality printed circuit board units, there is no problem associated with the use of the paint such as a contamination.

4 Claims, 4 Drawing Sheets

—PRIOR ART—

MARKING BAD PRINTED CIRCUIT BOARDS FOR SEMICONDUCTOR PACKAGES

BACKGROUND OF THE INVENTION

1. Field of the Invention

The present invention relates to a method for marking poor quality printed circuit board units of a printed circuit board strip and such a printed circuit board strip. In particular, a method for marking poor quality printed circuit board units of a printed circuit board strip for ball grid array semiconductor packages and such a printed circuit board strip in which poor quality printed circuit board units thereof are marked.

2. Description of the Prior Art

Typically, ball grid array (BGA) semiconductor packages have a configuration including a printed circuit board, one or more semiconductor chips mounted on one surface (namely, upper surface) of the printed circuit board, and an array of solder balls attached to the other surface of the printed circuit board and adapted to provide input and output terminals for the semiconductor chip or chips. Such BGA semiconductor packages have been widely used as multi-pin devices having 200 pins or more, integrated circuits of very large scale integration (VLSI) and microprocessors.

Referring to FIG. 2, a typical BGA semiconductor package is illustrated. As shown in FIG. 1, the BGA semiconductor package, which is denoted by the reference numeral 1, includes a printed circuit board 11a which comprises a resin substrate 18. A plurality of upper and lower conductive traces 13 are formed on the upper and lower surfaces of the resin substrate 18, respectively. The upper and lower conductive traces 13 are electrically connected through via holes 14. Upper and lower solder masks 19 are formed on the upper and lower surface of the printed circuit board 11a, respectively. The upper solder mask is arranged on the outer portion of the upper surface of the printed circuit board 11a except for the finger portions of the upper conductive traces. The lower solder mask is arranged on the entire lower surface of the printed circuit board 11a except for solder ball pads adapted to fuse solder balls 40. However, the arrangements of the solder masks 13 are not limited to the above-mentioned case. The printed circuit board 11a has a chip mounting region 12 at its central portion. At the chip mounting region 12, the printed circuit board 11a is also provided with a plurality of throughout holes 12a adapted to easily discharge heat generated during the operation of the semiconductor chip 30. However, the provision of the throughout holes 12a is optional. At the chip mounting region 12, the resin substrate 18 may be exposed or coated with a metal thin film having a desired pattern.

The fabrication of the conventional BGA semiconductor package 1 is carried out as follows. That is, the semiconductor chip 30 is first mounted on the central portion of the printed circuit board 11a corresponding to the chip mounting region 12 by means of a silver-filled epoxy resin 33 which is an adhesive exhibiting a superior thermal conductivity (semiconductor chip mounting step). Thereafter, bond pads (not shown) of the mounted semiconductor chip 30 are electrically connected to the conductive traces 13 formed on the printed circuit board 11a by bonding wires 31 (wire bonding step). A resin seal 32 is then molded on the printed circuit board 11a to protect the semiconductor chip 30 and bonding wires 31 from the environment (resin seal molding step). A plurality of solder balls serving as input/output terminals are then fused on the lower surface of the printed circuit board 11a (solder ball fusing step). The solder balls 40 are electrically connected to the bond pads of the semiconductor chip 30, respectively.

Although FIG. 2 illustrates the case having a simple printed circuit board configuration in which one printed circuit board sheet is used, a multi-layer printed circuit board configuration may be used which uses a plurality of laminated printed circuit board sheets to obtain an increased solder ball density per unit area.

The printed circuit board 11a, which is used to fabricate a BGA semiconductor package, is available from a printed circuit board strip. Such a printed circuit board strip is illustrated in FIG. 3. As shown in FIG. 31, the printed circuit board strip, which is denoted by the reference numeral 10, has a plurality of printed circuit board units 11 arranged in the form of a strip.

Each printed circuit board unit 11 is defined with a chip mounting region 12 at the central portion of its upper surface. Each printed circuit board unit 11 is also provided at its upper surface with a plurality of conductive traces 13 respectively having via holes 13. The conductive traces 13 are arranged around the chip mounting region 12. The conductive traces 13 are plated with gold or silver at their inner portions (that is, finger portions) to achieve an easy wire bonding to the bond pads of a semiconductor chip mounted on the printed circuit board unit 11. Optionally, heatdischarging throughout holes 12a are formed in the portion of the printed circuit board unit 11 corresponding to the chip mounting region 12. In FIG. 3, the thin broken line indicates a resin seal molding region where a resin seal is molded whereas the thick broken line indicates a cutting line 16 along which semiconductor packages, obtained after the completion of a resin seal molding step, are cut so that they are separated from one another. Generally, cutting-assistant holes 17a are provided at four corners of each cutting line 16 which has a square shape. The printed circuit board strip 10 is provided at both side portions thereof with slots 17b for receiving feeding pins, respectively. By virtue of such slots 17b, the printed circuit board strip 10 can be accurately fed along a required process line while being easily fixed at an accurate processing position. An anti-bending slot 17c is formed in the printed circuit board strip 10 between adjacent printed circuit board units 11. The anti-bending slot 17c serves to prevent the printed circuit board strip 10 from being permanently bent under high temperature and/or high pressure conditions involved in the resin adhesive curing, wire bonding and molding processes.

The reason why such a printed circuit board strip is used in the fabrication of BGA semiconductor packages is to improve the process efficiency in the fabrication of semiconductor packages. The use of such a printed circuit board strip enables an accurate feeding of semiprocessed products to accurate positions for required processes and a simultaneous and multiple processing for a plurality of printed circuit board units. For this reason, in-process lines for the manufacture of semiconductor packages, the process flow thereof is conducted by printed circuit board strips. In the resin seal molding step, accordingly, a plurality of resin seals are molded on all the printed circuit board units 11 of one printed circuit board strip 10 at the resin seal molding regions 15, respectively, in a simultaneous manner in a single mold. After the formation of the resin seals, the printed circuit board units 11 are cut along the cut lines 16 so that they are separated from one another. This step is called "a singulation step".

Where such a printed circuit board strip is used for the fabrication of BGA semiconductor packages, it is necessary to check individual printed circuit board units of the printed circuit board strip in order to find poor quality printed circuit board units involving a short circuit or a degraded appearance. Such poor units should be distinguished from good units by marking those poor units with a particular sign so as to prevent the poor units from being mounted with expensive semiconductor chips or from being subjected to the wire bonding process. Practically, the rate of poor quality printed circuit board units in one printed circuit board strip is relatively high. Where only the good printed circuit board units are subjected to the processes for the fabrication of semiconductor packages, it is possible to reduce the manufacturing costs.

An example of a method for marking poor quality printed circuit boards is illustrated in FIG. 3. In accordance with the illustrated method, printed circuit boards 11', which are determined to be poor, are marked with a sign "X" on their whole portion, using paint (mainly, a white paint).

However, this method, in which poor quality printed circuit board units are marked using paint, has the following problems.

A certain number of printed circuit board strips fabricated in the above-mentioned manner are packed in a vacuum under the condition in which they are stacked. The packed printed circuit board strips are then delivered to the manufacturer of semiconductor packages. In such a pack, however, a gap may be formed between adjacent ones of the stacked printed circuit board strips due to the thickness of the paint used to mark printed circuit board strips determined as being "poor". In particular, it is frequent that the generation of poor quality printed circuit boards concentrates at the same, particular positions of printed circuit board strips. This results in an accumulative increase in the difference in height between opposite ends of the uppermost printed circuit board strip in the pack. As a result, the stacked printed circuit board strips in the pack may be permanently deformed, for example, permanently bent, due to the vacuum exerted in the pack. Where the fabrication of semiconductor packages is conducted using such deformed printed circuit board strips, poor semiconductor packages are produced. Thus, the process efficiency is degraded. Furthermore, an increase in the costs occurs due to the waste of printed circuit board strips and semiconductor packages.

Where a number of packs of stacked printed circuit board strips including both the poor and good ones are transported under the condition in which those packs are stacked, friction may occur between adjacent printed circuit board strips in each pack during the transportation because those printed circuit board strips may move relatively to each other while being in contact with each other. Due to such friction, the "degradation"-marking paint coated on the printed circuit board strips is likely to contaminate the printed circuit board strips. The use of such contaminated printed circuit board strips results in a production of poor semiconductor packages.

Since the resin seal molding step is conducted in a mold at a high temperature of about 175° C. and a high pressure of 1,000 psi, the paint coated on a printed circuit board strip is transferred to the upper mold during the conduction of the resin seal molding step due to the high temperature and pressure conditions. As a result, the surface of the upper mold is contaminated.

Furthermore, when a resin seal molding is carried out for a subsequent printed circuit board strip, the paint on the surface of the upper mold is transferred to the upper surface of the printed circuit board strip. As a result, normal printed circuit boards of the strip may be contaminated.

Where the sign "X" painted on a poor quality printed circuit board is relatively small, it is difficult to find that sign after the completion of the resin seal molding step because a large portion of the sign is covered with the resin seal. As a result, it is difficult to distinguish poor quality printed circuit board units from normal ones. Typically, the resin seal molding is conducted in a single mold for all the printed circuit board units of the strip including both poor and normal printed circuit board units, as different from the semiconductor chip mounting step and wire bonding step.

When the upper mold is clamped onto a portion of the printed circuit board strip on which the "degradation"-indicating sign is painted (upon coupling the upper and lower molds), a gap is formed between the upper mold and the printed circuit board strip due to the thickness of the paint. When melt resin is introduced under pressure into a cavity defined between the upper and lower molds, it is outwardly leaked through the gap. The leaked resin is bled out onto the upper surface of the printed circuit board strip 10. As a result, a degradation in the quality of semiconductor packages occurs due to such a resin left on the printed circuit board strip. In addition, the appearance of semiconductor packages is degraded.

In addition, the printed circuit board strip may be bent due to an additional process which is carried out at a high temperature to dry and cure the "degradation"-indicating paint. A lengthened processing time is required due to the time taken to naturally cure the paint.

SUMMARY OF THE INVENTION

Therefore, an object of the invention is to provide a method for marking poor quality printed circuit board units of a printed circuit board strip for semiconductor packages, which method is capable of preventing printed circuit board strips packed in a stacked and vacuum state from being bent and contaminated by paint coated on those strips to mark poor quality printed circuit boards, preventing the mold from being contaminated by the paint, and easily recognizing printed circuit board units which are determined as being poor, thereby efficiently performing the fabrication of semiconductor packages using only normal printed circuit board units without mounting expensive semiconductor chips on poor quality printed circuit board units or performing a wire bonding process for such poor units.

Another object of the invention is to provide a printed circuit board strip in which poor quality printed circuit board units thereof are marked in accordance with the method accomplishing the first object of the invention.

In accordance with one aspect, the present invention provides a method for marking a poor quality printed circuit board unit of a printed circuit board strip for ball grid array semiconductor package; comprising providing the printed circuit board strip having a plurality of printed circuit board units including at least one poor quality printed circuit board unit while being arranged in the form of a strip, each of the printed circuit board units including a semiconductor chip mounting region defined at a central portion of the upper surface of the resin substrate, a resin seal molding region formed on the outer surface of the semiconductor chip mounting region, and a cutting line formed on the resin substrate while being spaced from an outer edge of the resin seal molding region, the cutting line being adapted to separate the associated printed circuit board unit from an adjacent printed circuit board unit; and punching at least one degradation-indicating hole is at least partially formed in the poor quality printed circuit board unit at a region defined between the outer edge of the resin seal molding region of the poor quality unit and the cutting line associated with the poor quality unit.

In accordance with another aspect, the present invention provides a printed circuit board strip for ball grid array semiconductor packages having a plurality of printed circuit board units arranged in the form of a strip, each of the printed circuit board units including a semiconductor chip mounting region defined at a central portion of the upper surface of the resin substrate, a resin seal molding region formed on the outer surface of the semiconductor chip mounting region, and a cutting line formed on the resin substrate while being spaced from an outer edge of the resin seal molding region, the cutting line being adapted to separate the associated printed circuit board unit from an adjacent printed circuit board unit, wherein the strip includes at least one poor quality printed circuit board unit, and wherein at least one degradation-indicating hole is at least partially formed in the poor quality printed circuit board unit at a region defined between the outer edge of the resin seal molding region of the poor quality unit and the cutting line associated with the poor quality unit.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1A:
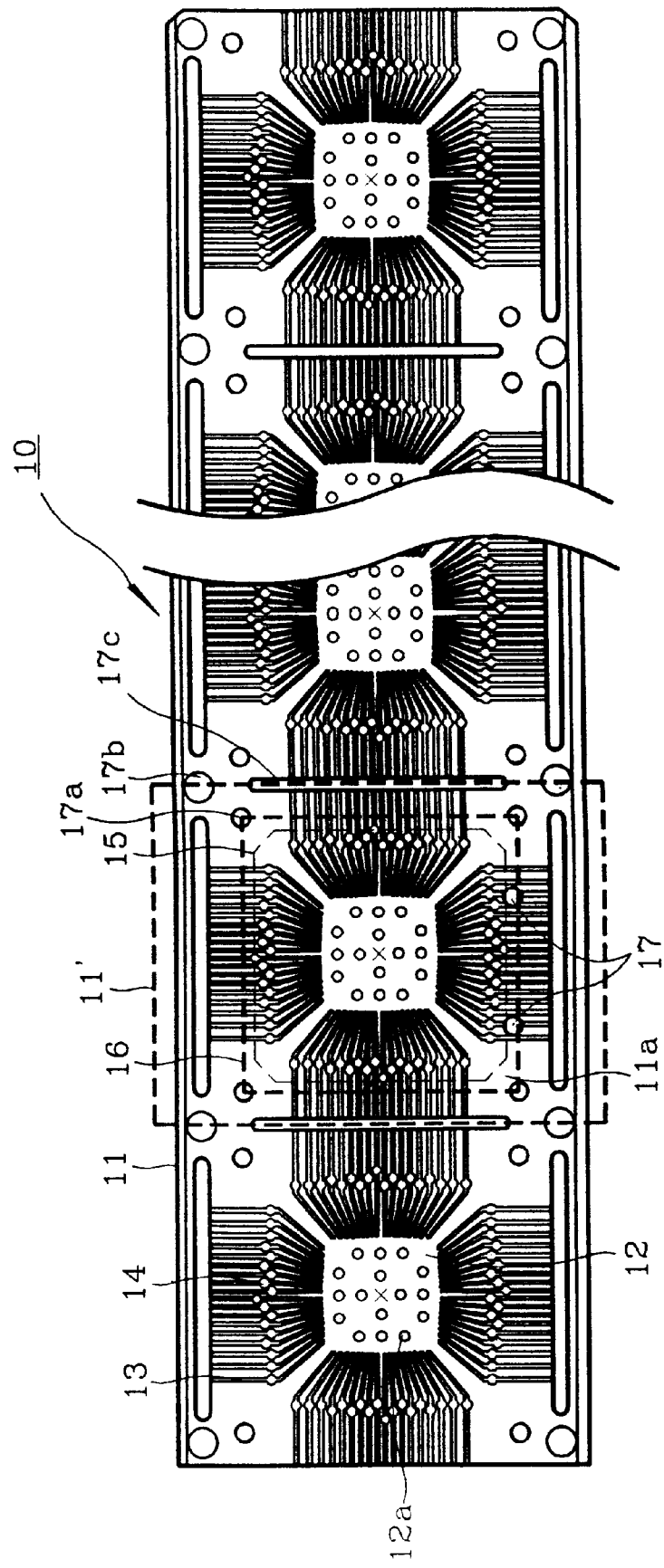
FIGS. 1A and 1B are plan views respectively illustrating a printed circuit board strip for BGA semiconductor packages in which poor quality printed circuit board units are marked in accordance with a method of the present invention.
Figure 1B:
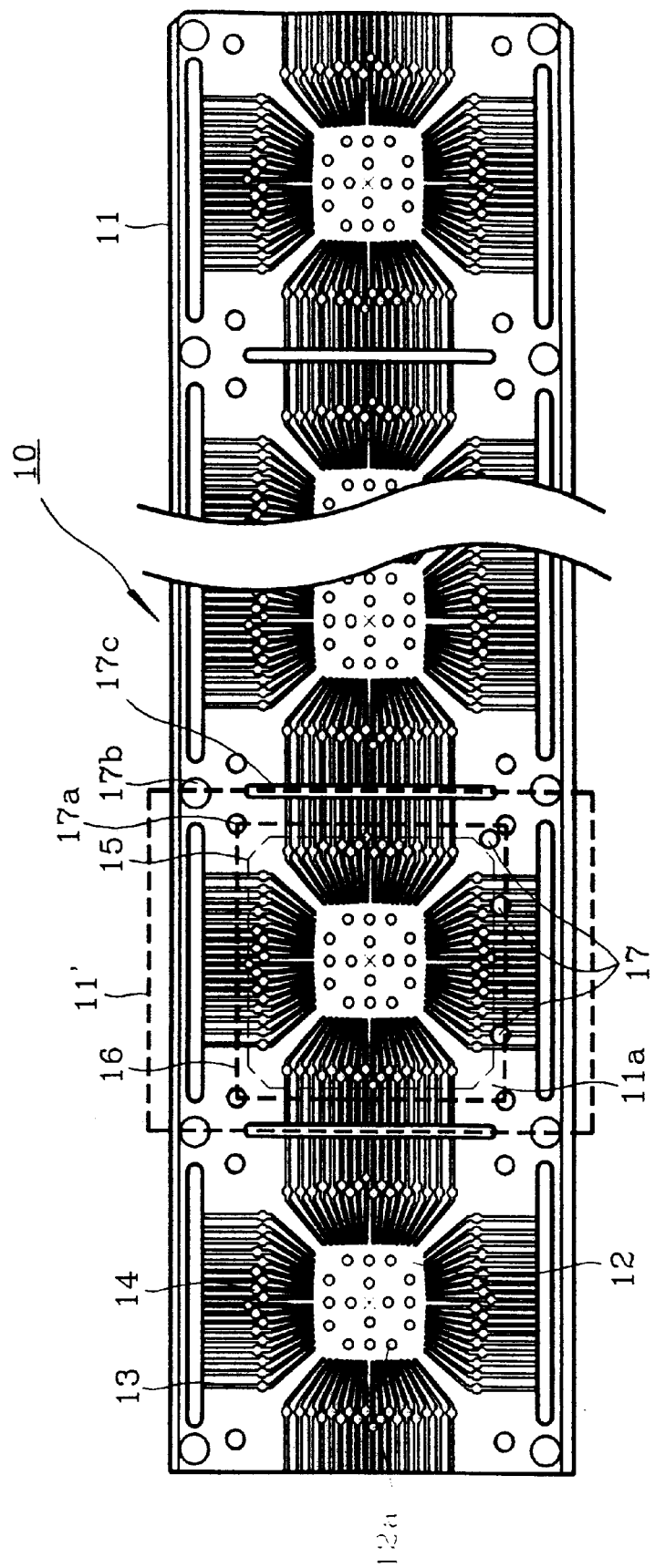

FIGS. 1A and 1B illustrate a printed circuit board strip for BGA semiconductor packages in which poor quality printed circuit board units are marked in accordance with a method of the present invention, respectively. As shown in FIGS. 1A and 1B, the printed circuit board strip, which is denoted by the reference numeral 10, includes a plurality of printed circuit board units 11 (typically, four to eight units) arranged in the form of a strip. In FIGS. 1A and 1B, poor quality printed circuit board units are denoted by the reference numeral 11'.

Figure 2:
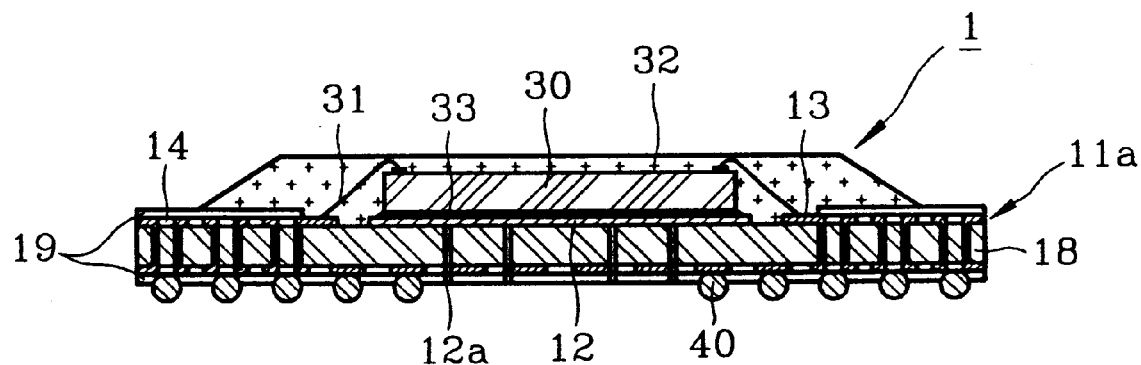
FIG. 2 is a sectional view illustrating a typical BGA semiconductor package fabricated using a printed circuit board unit.
Figure 3:
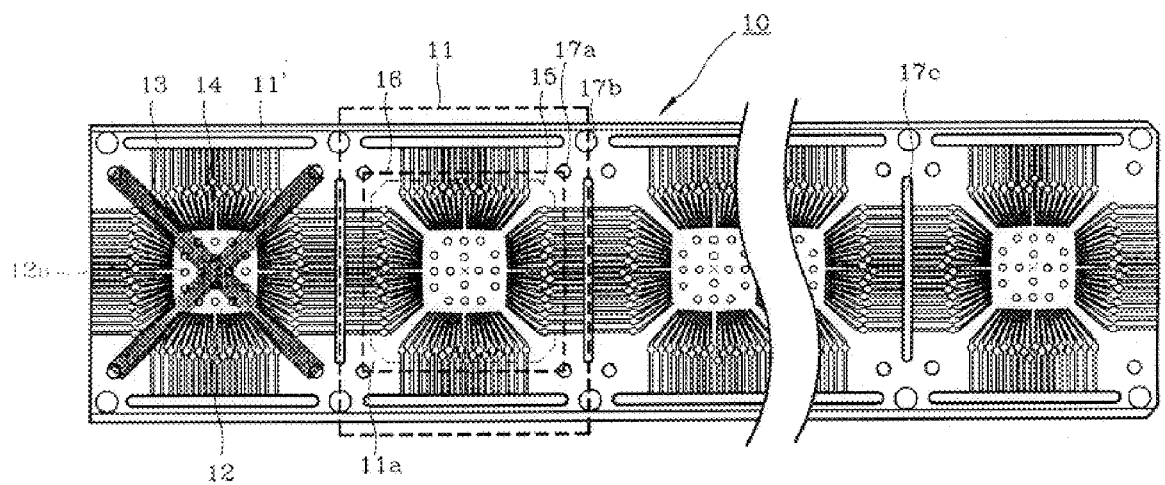
FIG. 3 is a plan view illustrating a printed circuit board strip in which poor quality printed circuit board units thereof are marked in accordance with the conventional method.

Since the configuration of normal printed circuit board units 11 is the same as that in FIG. 3, its description will be omitted.

Where such a printed circuit board strip is used for the fabrication of BGA semiconductor packages, individual printed circuit board units of the printed circuit board strip are checked to find poor quality printed circuit board units involving a short circuit or a degraded appearance, as mentioned above. In order to distinguish such poor quality printed circuit board units from good units, at least one "degradation"-indicating hole 17 is formed in each poor unit at a region defined between the outer edge of the resin seal molding region 15 and the cutting line 16 in accordance with the present invention.

Where BGA semiconductor packages (FIG. 2) are fabricated using the printed circuit board strip 10, the above-mentioned chip mounting step, wire bonding step, resin seal molding step, singulation step and solder ball fusing step are carried out in this order. In the fabrication of such BGA semiconductor packages, poor quality printed circuit board units 11' provided with "degradation"-indicating holes 17 are easily distinguished from normal ones, so that they are skipped. Accordingly, it is possible to completely and easily prevent the poor units from being mounted with expensive semiconductor chips at the semiconductor chip mounting step. It is also possible to prevent the poor units from being subjected to the wire bonding process. Thus, an improvement in process efficiency is achieved while reducing the manufacturing costs.

At the resin seal molding step, the printed circuit board strip 10 is positioned in a single mold which has upper and lower molds. The resin seal molding is conducted for all the printed circuit board units of the strip including both poor and normal printed circuit board units. In other words, resin seals are formed on even the poor quality printed circuit board units 11'. For this reason, each "degradation"-indicating hole 17 formed in each poor quality printed circuit board unit should be at least partially positioned beyond the resin seal molding region 15. Where the "degradation"-indicating hole 17 is positioned within the resin seal molding region 15, it is hidden from view by the resin seal formed at the resin seal molding step. In this case, it is impossible to distinguish poor quality printed circuit board units 11' from normal units at subsequent steps. Where each "degradation"-indicating hole 17 is positioned at the outer edge of the resin seal molding region 15 in such a manner that it is partially positioned beyond the resin seal molding region 15, melt resin is introduced into a region defined by the "degradation"-indicating hole 17 at the resin seal molding step. As a result, an arc-shaped protrusion, which is integral with the resin seal, is formed on the outside of the resin seal. By this arc-shaped protrusion, it may be possible to easily distinguish poor quality printed circuit board units 11' from normal ones.

Where each "degradation"-indicating hole 17 is wholly positioned beyond the cutting line 16, it is impossible to distinguish poor quality printed circuit board units 11' from normal ones after cutting those units along cutting lines at the singulation step following the resin seal molding step.

The position of the "degradation"-indicating hole 17 has no particular limitation, in so far as it is at least partially positioned within a region defined between the outer edge of the resin seal molding region 15 and the cutting line 16. Preferably, the "degradation"-indicating hole 17 is formed on the outside of a corner of the resin seal molding region 15 where a relatively large area is present. The number, shape and size of "degradation"-indicating holes 17 can be optionally selected.

The formation of "degradation"-indicating holes 17 is simply achieved in accordance with a conventional method using a conventional drill or punch after the completion of a degradation test for individual printed circuit board units of each printed circuit board strip.

As apparent from the above description, in accordance with the present invention, poor quality printed circuit board units are marked with holes without using any paint. Accordingly, the use of an additional process, which is carried out at a high temperature to dry and cure the "degradation"-indicating paint, is eliminated. As a result, there is no strip bending phenomenon. It is also possible to reduce the processing time.

The printed circuit board strip provided with holes for marking poor quality printed circuit board units in accordance with the present invention has various advantageous effects.

That is, there is no difference in height or thickness between the "degradation"-marked unit and the normal unit. Accordingly, even when a plurality of printed circuit board strips are packed in a vacuum under the condition in which they are stacked, there is no phenomenon that those strips in the pack are permanently deformed, for example, permanently bent. Also, there is no phenomenon that melt resin is leaked from the mold, thereby causing it to be bled out onto the upper surface of the printed circuit board strip.

Since no paint is used to mark poor quality printed circuit board units, there is no problem associated with the use of the paint. Where the paint is used, the "degradation"-marking paint coated on the printed circuit board strips is likely to contaminate the printed circuit board strips due to friction occurring between adjacent printed circuit board strips in each pack during the transportation. In accordance with the present invention, however, such a problem is avoided.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for marking a poor quality printed circuit board unit of a printed circuit board strip for ball grid array semiconductor packages; comprising providing the printed circuit board strip having a plurality of printed circuit board units including at least one poor quality printed circuit board unit while being arranged in the form of a strip, each of the printed circuit board units including a semiconductor chip mounting region defined at a central portion of the upper surface of the resin substrate, a resin seal molding region formed on the outer surface of the semiconductor chip mounting region, and a cutting line formed on the resin substrate while being spaced from an outer edge of the resin seal molding region, the cutting line being adapted to separate the associated printed circuit board unit from an adjacent printed circuit board unit; and punching at least one at least partially formed degradation-indicating hole is at least partially formed in the poor quality printed circuit board unit at a region defined between the outer edge of the resin seal molding region of the poor quality unit and the cutting line associated with the poor quality unit.

2. The method in accordance with claim 1, wherein the degradation-indicating hole overlaps with the outer edge of the resin seal molding region so that it is at least partially positioned beyond the resin seal molding region.

3. The method in accordance with claim 1, wherein the degradation-indicating hole overlaps with the cutting line so that it is at least partially positioned inside the cutting line.

4. The method in accordance with claim 1, wherein the degradation-indicating hole is positioned at a region defined between the outside of a corner of the resin seal molding region and the cutting line.

* * * * *